United States Patent [19]
Jelinek

[11] Patent Number: 5,595,241
[45] Date of Patent: Jan. 21, 1997

[54] WAFER HEATING CHUCK WITH DUAL ZONE BACKPLANE HEATING AND SEGMENTED CLAMPING MEMBER

[75] Inventor: Vaclav Jelinek, River Edge, N.J.

[73] Assignees: Sony Corporation, Tokyo, Japan; Materials Research Corp., Orangeburg, N.Y.

[21] Appl. No.: 319,884

[22] Filed: Oct. 7, 1994

[51] Int. Cl.$^6$ .................................................. F28F 7/00
[52] U.S. Cl. .................... 165/80.1; 165/80.2; 165/80.4; 118/725; 219/405
[58] Field of Search .......................... 156/345; 118/725, 118/726; 219/390, 405, 411; 392/416, 418; 165/80.2, 80.1, 80.4

[56] References Cited

U.S. PATENT DOCUMENTS

| | | | |
|---|---|---|---|
| 3,369,989 | 2/1968 | Kay et al. . | |
| 3,633,537 | 1/1972 | Howe | 118/725 |
| 4,396,640 | 8/1983 | Rocheleau et al. . | |
| 4,470,369 | 9/1984 | Edgerton . | |
| 4,535,227 | 8/1985 | Shimizu . | |
| 4,647,361 | 3/1987 | Bauer . | |
| 4,680,061 | 7/1987 | Lamont, Jr. . | |
| 4,680,451 | 7/1987 | Gat et al. . | |
| 4,724,621 | 2/1988 | Hobson et al. | 165/80.4 |
| 4,771,730 | 9/1988 | Tezuka . | |
| 4,777,022 | 10/1988 | Boldish et al. . | |
| 4,810,342 | 3/1989 | Inoue . | |
| 4,821,674 | 4/1989 | deBoer et al. . | |
| 4,909,314 | 3/1990 | Lamont, Jr. . | |
| 4,933,063 | 6/1990 | Katsura et al. . | |
| 4,949,783 | 8/1990 | Lakios et al. | 165/80.1 |
| 4,971,653 | 11/1990 | Powell et al. . | |
| 4,987,856 | 1/1991 | Hey et al. . | |
| 4,996,942 | 3/1991 | deBoer et al. . | |
| 5,063,031 | 11/1991 | Sato . | |
| 5,113,929 | 5/1992 | Nakagawa et al. | 118/725 |
| 5,133,286 | 7/1992 | Choo et al. . | |
| 5,230,741 | 7/1993 | vande Ven et al. | 118/725 |
| 5,267,607 | 12/1993 | Wada . | |
| 5,294,778 | 3/1994 | Carman et al. . | |
| 5,425,812 | 6/1995 | Tsutahara et al. | 118/725 |
| 5,460,684 | 10/1995 | Saeki et al. | 118/725 |
| 5,467,220 | 11/1995 | Xu | 219/405 |

FOREIGN PATENT DOCUMENTS

| | | |
|---|---|---|
| 0452779 | 10/1991 | European Pat. Off. . |
| 4010528 | 1/1992 | Japan | 118/725 |

*Primary Examiner*—F. Daniel Lopez
*Assistant Examiner*—Mark Sgantzos
*Attorney, Agent, or Firm*—Wood, Herron & Evans, P.L.L.

[57] ABSTRACT

A wafer heating chuck includes a backplane for mounting the wafer thereon. A rear surface of the backplane includes an outer annular recess with an outer angled wall. An outer annular heater is located within the recess and has an outer surface complementarily angled with respect to the wall. An inner annular heater resides inside the outer heater, adjacent the rear surface. A clamping member secured to the backplane includes inner and outer retainers which separately clamp the inner and outer heaters, respectively, to the backplane to assure solid to solid contact for optimum heat transfer therebetween. Each inner retainer is held by a radially cantilevered segment so that tightening of one inner retainer does not affect clamping force applied by adjacent inner retainers. Similarly, the outer retainers operate on cantilevered segments to yield independent clamping forces. Sensors sense backplane temperature at the inner and outer regions. Sensors are mounted to the backplane proximate the inner and outer heaters to measure the temperature of the backplane. Coolant is directed through channels in the backplane and through channels in a cooling ring secured to a backplane to influence the temperature of the backplane. A controller connects to the heaters, the sensors and coolant supplies for temperature profiling to achieve temperature uniformity during processing for a wafer mounted to the backplane of the heating chuck.

41 Claims, 5 Drawing Sheets

WAFER HEATING CHUCK WITH DUAL ZONE BACKPLANE HEATING AND SEGMENTED CLAMPING MEMBER

FIELD OF THE INVENTION

This invention relates to a wafer heating chuck, and more particularly, to a wafer heating chuck backplane designed to promote temperature uniformity during processing for a wafer mounted thereon.

BACKGROUND OF THE INVENTION

A typical wafer mounting arrangement includes a backplane for supporting a wafer during wafer processing and a clamping device called a wafer holder. For a number of wafer processes, including sputter deposition, the wafer must be heated while mounted to the backplane. Prior wafer processing devices have employed one or more of a number of different types of wafer heating mechanisms for heating the backplane and/or the wafer, including resistive heating, RF induction heating, backside gas heat conduction, radiant heat, etc. This invention relates to the use of a resistive element to heat the backplane, thereby indirectly heating a wafer mounted thereon.

For most wafer coating processes, including sputter deposition, to obtain uniformity in the sputtered film of particles, the temperature of the wafer must be uniform across its entire surface area. This requires consistent heat transfer between the heating element and the backplane.

Effective heat transfer between the backplane and a resistive element depends upon maintaining good surface contact between the resistive element and the backplane. If the resistive element is shaped to be embedded within a correspondingly shaped void in the backplane, machining of both components must be very precise. This precise machining can be relatively expensive. Moreover, even if a precise fit is achieved, over a period of use, some radial expansion and contraction of either the backplane or the resistive element caused by heating and cooling may adversely affect the precise and tightly machined fit.

As an alternative to embedding the resistive element to the backplane, the resistive element may be secured to the backplane by one or more bolts. This allows the resistive element to be tightened into good contact with the backplane at the beginning of each period of use. However, most resistive elements of this type are annular in shape. As a result, tightening of one of the bolts invariably results in some loosening of the adjacent bolts. Thus, it is difficult to achieve consistent surface to surface contact between the annular resistive heating element and the backplane around the entire circumference of the annular heating element.

In short, it is difficult and/or costly to maintain good solid to solid surface contact between a resistive heating element and a backplane to assure effective heat transfer therebetween and uniform heating of a wafer.

For a wafer heating chuck with an annular resistive heating element contacting a backside of the backplane, heat transferred to the backplane will drop off radially outside of the resistive heating element. As a result of the heating chuck being mounted to cooler parts, the wafer temperature at the peripheral edge of the wafer will be lower than the wafer temperature at the center or midportion of the wafer.

One possible solution to this problem of temperature drop-off adjacent the wafer perimeter involves using backplane and a single resistive element larger than the wafer diameter and to contact the backplane with the heating element below the entire surface area of the wafer. However, many existing wafer heating chucks have only a limited amount of space for locating the heater behind the backplane and clamping it thereto, due to the space requirements for additional components such as cooling channels, mounting bolts, gas inlets etc. Thus, unless one were to redesign the entire process chamber and wafer holder, this solution is not workable.

Even if a single resistive heating element could be employed to heat the entire back surface of an oversized backplane, this would not guarantee temperature uniformity across the wafer. Heat generated in the processing chamber by the process itself also adds heat to the backplane, usually in a non-uniform manner. For example, during cathode sputtering, because the target and the wafer are located quite close, the ionized plasma confined by a magnetic field adjacent the target surface generates heat at both the target and the wafer. To maximize utilization of target material, it is common to provide multiple erosion zones by using more than one magnetic field and/or to move one plasma-confining magnetic field, thereby moving the plasma and changing the location of the process generated heat. The presence of one or more annular zones of process-generated heat further complicates attempts to achieve uniformity in wafer temperature.

It is an objective of the invention to assure solid to solid surface contact between a resistive heating element and a backplane over the lifetime of the heating element and the backplane.

It is another objective of the invention to more effectively heat the perimeter of a backplane without requiring substantial redesign of the entire process chamber and wafer holder.

It is still another objective of this invention to achieve uniformity in wafer temperature across the surface area of a wafer during sputter deposition thereon, despite heat generated by a sputter plasma.

The above-stated objectives are met by a wafer heating chuck which employs a combination of features, including a wedge-shaped outer heater shaped to reside in a wedge-shaped recess in the backplane, so that good surface contact therebetween may be obtained by applying only a minimal clamping force. The wedge shape of the heater also enables more electrical heat to be dissipated into the outer portion of the backplane, where heat loss is greatest.

The invention also employs a clamping member for separately clamping the inner and outer heaters to the backplane to assure intimate solid to solid contact therebetween. In one embodiment, the clamping member includes separately cantilevered tabs which enable the inner heater to be firmly clamped to the backplane around its entire circumference. In an alternative embodiment, two sets of cantilevered tabs enable both the inner and outer heaters to be firmly clamped to the backplane around its circumference. The cantilevered tabs also flex to ensure positive contact during thermal expansion and contraction. The two heaters are independently controllable, so that the outer heater can be used effectively to eliminate heat loss at the perimeter of the backplane.

In addition to the two heaters and the clamping member, the invention includes a pair of sensors for sensing temperature at two spaced regions of the backplane located adjacent the inner and outer heaters. An electrical controller connected to the heaters and the sensors allows the backplane temperature to be profiled to compensate for process heat, such as localized heating caused by a confined plasma during cathode sputtering. The heat added to the wafer by the wafer heating chuck components is concentrated in those areas which are not heated by process generated heat. As a result, the composite heat generated by both sources results in substantial temperature uniformity across the wafer.

Additionally, the backplane includes a recess in communication with a gas inlet to supply a backside gas between the wafer and backplane, thereby to speed up heating and cooling of the wafer.

According to one embodiment of the invention, a wafer heating chuck includes a backplane, two resistive heaters, a clamping member, two temperature sensors, a gas inlet, and inner and outer cooling channels. The backplane includes a front surface for supporting a wafer thereon. The front surface includes a recess supplied with a backside gas via a gas inlet located in the center of the backplane. The recess includes three spokes which extend radially outwardly from the center and a circumferential ring which interconnects the outer ends of the radial spoke portions adjacent the peripheral edge of the backplane.

A second or rearward surface of the backplane includes a recess in an outer region thereof, adjacent the peripheral edge of the backplane. The recess includes an outer angled wall. An outer annular heater resides within the recess, and the outer heater includes an angled surface which is complementary with respect to the angle of the recess wall. An inner annular heater resides radially on the backplane inside the outer heater. A clamping member secures to the second surface of the backplane, as by bolts, and the clamping member separately clamps the outer and inner heaters to the second surface of the backplane to assure good solid to solid contact for optimum heat transfer therebetween. A plurality of outer threadable retainers supported by the clamping member enable the outer annular heater to be clamped to the backplane with a force which may be set independently of the bolts which hold the clamping member to the backplane.

Additionally, a plurality of inner threadable retainers enable the inner annular heater to be clamped to the backplane with a force which is also independent of the securing bolts. Moreover, each of the inner retainers is supported by an inner radially cantilevered, trapezoid-shaped tab so that tightening of one of the inner retainers does not adversely affect the clamping force applied to the inner heater by adjacent inner retainers. Stated another way, when threadably torquing an inner retainer against the inner annular heater, a flexing force which is applied to the clamping member in the opposite direction, i.e. away from the backplane, acts only on a single tab, so that each inner retainer and associated tabs may be set and maintained at a predetermined clamping force independent of the other inner retainers and tabs.

In an alternative embodiment of the invention, the clamping member includes outer circumferentially cantilevered tabs which support the outer threaded retainers. Similar to the inner tabs, the outer tabs allow tightening of one of the outer retainers without adversely affecting the clamping force applied by adjacent outer retainers. Therefore, both inner and outer heaters and their contact to the backplane may be adjusted in segments around the backplane.

An inner heat sensor, preferably a thermocouple, mounts to the second surface of the backplane, between the inner annular heater and the gas inlet. An outer heat sensor, again preferably a thermocouple, mounts to the second surface of the backplane outside of the recess. The inner and outer sensors detect the temperature of the backplane at inner and outer regions thereof, respectively. The backplane further includes internal cooling channels supplied with gaseous or liquid coolant via inlet and outlet conduits. The wafer heating chuck also has an outer cooling ring or plate with outer cooling channels supplied with inlet and outlet conduits for circulation of a liquid coolant.

With inner and outer independently controllable heaters, the temperature of the inner and outer regions of the front surface of the backplane may be independently controlled. Because of the shape of the outer annular heater and its location within a recess in the backplane, and the configuration and operation of the segmented clamping member with respect to both heaters, the wafer heating chuck of the present invention assures consistently good solid to solid contact between the heaters and the backplane, thereby maximizing heat transfer therebetween. Additionally, use of backside gas enables this heat to be more quickly transferred between the backplane and the wafer mounted thereon, thereby reducing the time necessary to heat the wafer to an initial process temperature necessary to begin sputtering.

In one embodiment of the present invention, the resistive heating elements utilized for the inner and outer heater each includes a miniature tubular sheath surrounding two generally parallel wire elements and insulative material which provide the necessary resistance for the heaters. An alternative embodiment utilizes a single tubular sheath surrounding a coil and insulative material which provides resistance and subsequent heat for the heaters.

With independent control of each of the heaters, and by using feedback from the inner and outer temperature sensors to obtain some indication of the magnitude of process generated heat, the heat transferred to the backplane can be profiled in accordance with the temperature profile on the wafer induced by a plasma, thereby to produce a flat composite temperature profile across the wafer, indicating temperature uniformity across the surface area.

These and other features of the invention will be more readily understood in view of the following detailed description in the drawings.

BRIEF DESCRIPTION OF THE DRAWINGS

FIG. 9 is an alternative embodiment of the invention utilizing a larger backplane.

DETAILED DESCRIPTION OF THE DRAWINGS

Figure 1:
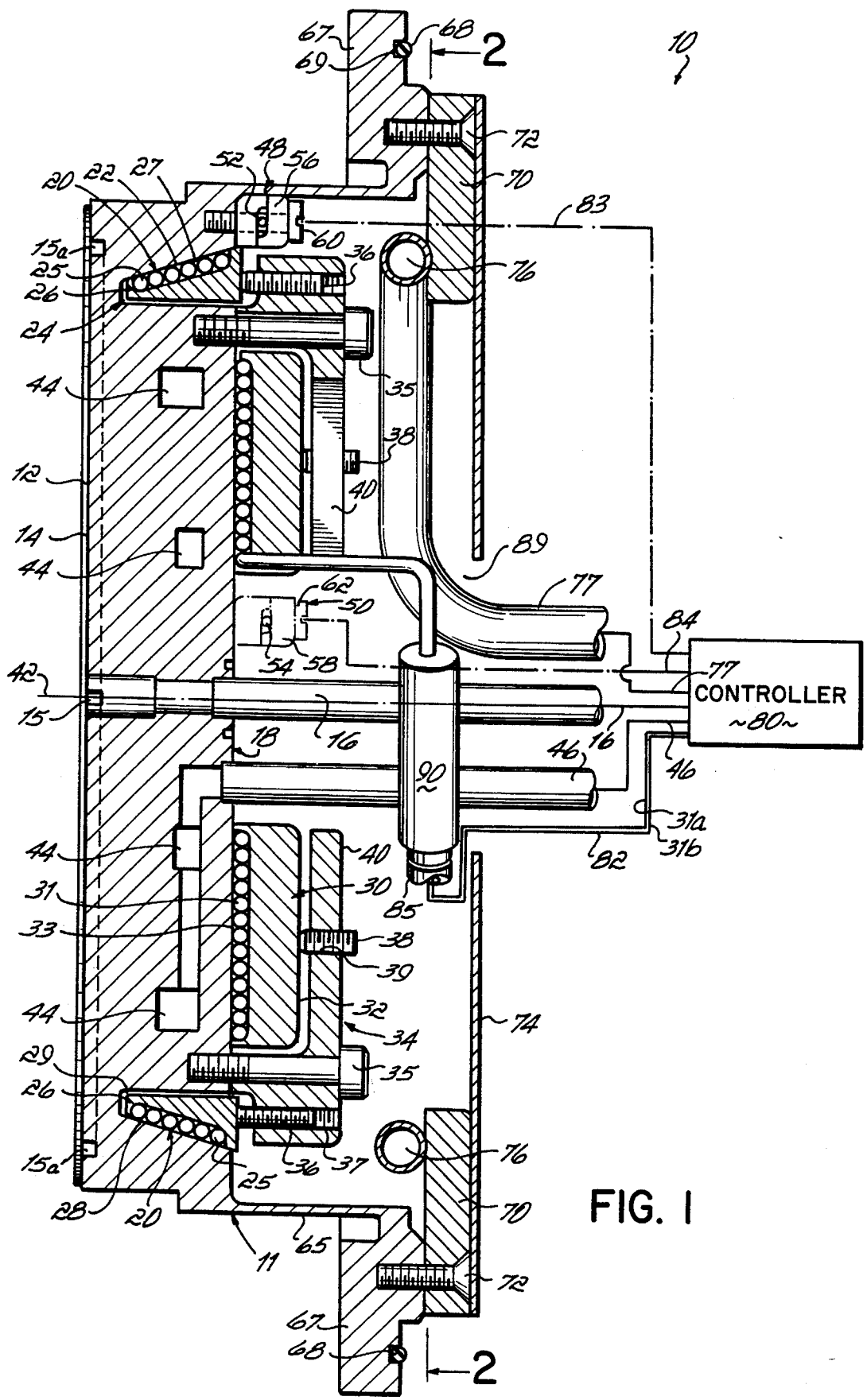
FIG. 1 is an axial cross-sectional view of a heating chuck constructed in accordance with one embodiment of the invention.

FIG. 1 is an axial cross-sectional view of a wafer heating chuck 10 constructed in accordance with an embodiment of the invention. The heating chuck 10 includes a backplane 11 for mounting a wafer 12 thereon during a wafer processing step, such as cathode sputtering to affect sputter deposition on the wafer 12. The backplane 11 is preferably formed of stainless steel.

The wafer 12 is supported on a first surface 14 of the backplane 11. Preferably, first surface 14 includes a recess 15 machined therein, and a gas inlet 16 supplies heating gas into the recess 15 between the first surface 14 and the wafer 12. Preferably, in plan view, the recess 15 comprises three spokes (not shown) extending radially outwardly from the inlet 16 and a circumferential portion 15a interconnecting the ends of the spokes adjacent the peripheral edge of the backplane 11. The use of backside heating gas in this manner promotes heat transfer between the backplane 11 and the wafer 12, thereby reducing wafer 12 heating time at the beginning of processing and reducing cool down time after processing. If desired, first surface 14 may be slightly convex to promote heat transfer between surface 14 and wafer 12.

The backplane 11 also has a second surface 18 located opposite the first surface 14. The second surface 18 includes an annular recess 20 located adjacent an outer perimeter of the backplane 11. The recess 20 includes an outer angled wall 22. An outer annular and wedge-shaped heater 24 resides within the recess 20. Outer heater 24 supplies heat to the backplane 11 adjacent the peripheral edge thereof. The outer annular heater 24 includes a wound element 25 of electrically resistive material held within a wedge-shaped support ring 26. Preferably, the wound element 25 is an Aerorod BXB heater sold by ARI Industries Inc. of Addison, Ill., Part No. BXB-09B-88-4T, and the ring 26 is made of Inconel 718, a high temperature nickel chrome alloy sold by Inco Alloys International. The element 25 actually comprises two electrical leads extending along a single insulative sheath. As will be discussed further hereinbelow, an alternative embodiment utilizes a tubular heater element and a copper wedge-shaped heater ring.

After being wound within the support ring 26, element 25 is flame sprayed with nickel to form an encapsulant 27 for the outer heater 24. Alternatively, the heater 24 may be encapsulated with copper and formed by casting around the element 25 and the ring 26.

The outer heater 24 includes an outer angled surface 28 which has an angle which is complementary with respect to angled wall 22 of second surface 18. Because of the wedge shape of the outer heater 24, as viewed in transverse cross-section, an average machining technique on the mated parts is sufficient to achieve good surface to surface contact for maximizing heat transfer to the backplane 11. The complementary angles assure good contact on the outside of the outer heater 24, with only a minimum clamping force required. This configuration reduces heat loss at the edge of the wafer 12 because the heat is transferred radially outwardly from the outer heater 24 to the backplane 11. A space or gap resides between the ring 26 and the second surface 18 of the backplane 11. This space 29 limits heat transfer in the radially inward direction, thereby concentrating heat transfer outwardly to the perimeter of the backplane 11.

Figure 4:
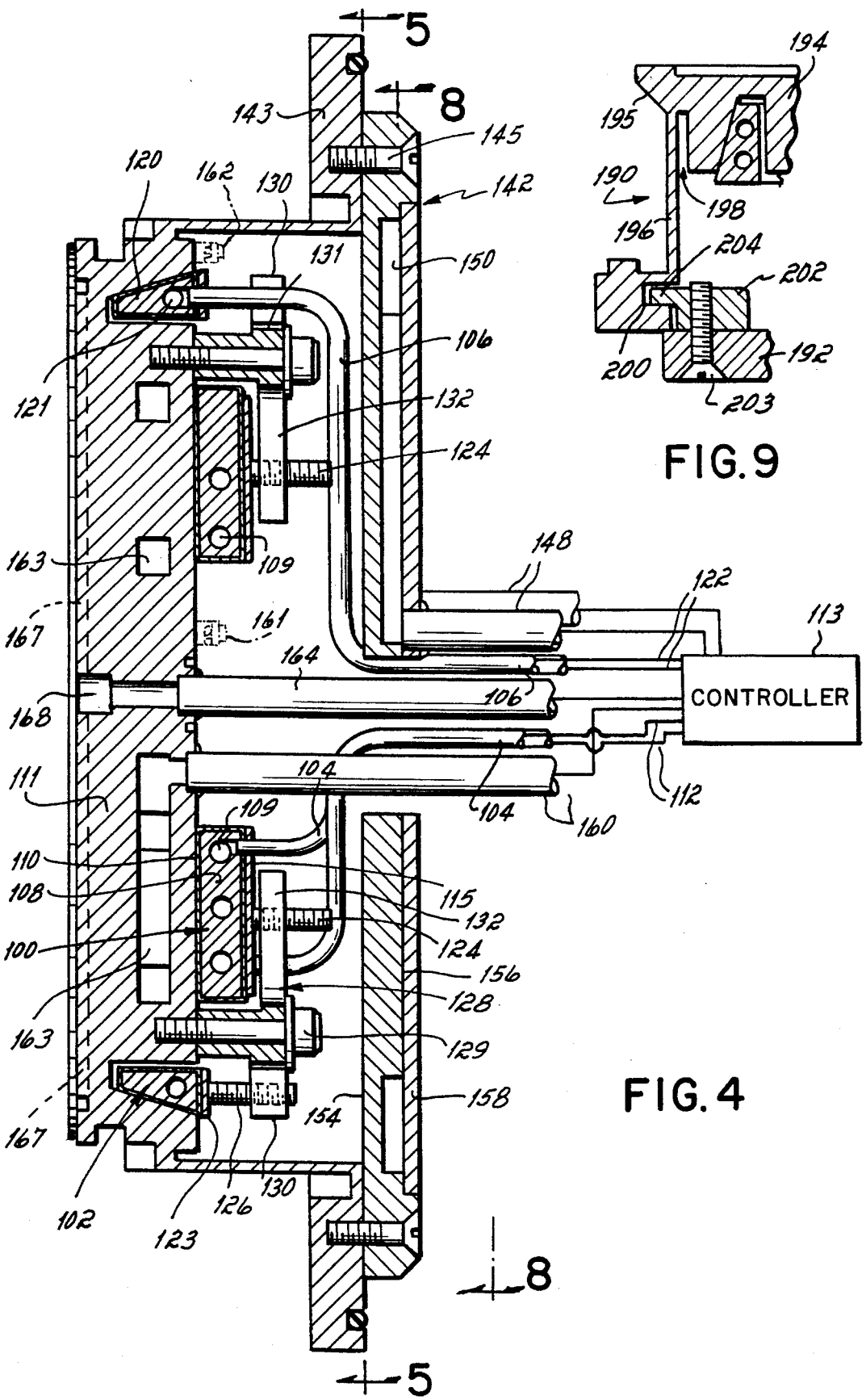
FIG. 4 is an axial cross-sectional view of a heating chuck constructed in accordance with an alternative embodiment of the invention.

An inner annular heater 30 resides radially inside of the outer annular heater 24. Inner annular heater 30 includes a wound element 31 supported within support ring 32 and sealed therein by a coating of encapsulant, as shown by reference numeral 33. Preferably, the ring 32 and the element 31 are the same material and parts, respectively, as identified above for the outer heater 24. Again, an alternative embodiment utilizes a tubular heater within a copper ring as shown in FIG. 4.

A clamping member 34 separately holds outer heater 24 and inner heater 30 in good surface to surface contact with outer and inner regions, respectively, of the backplane 11. Clamping member 34 is somewhat disk-shaped, and is held to backplane 11 by a plurality of circumferentially arranged bolts 35. Outer retainers 36, reside within internally threaded bores 37 of the clamping member 34, and the outer retainers 36 include an Allen head (FIG. 2) to permit threadable movement into contact with the outer annular heater 24. Preferably, each of the outer retainers 36 is tightened to a torque of about 30 pound-inches to supply sufficient clamping force to the outer annular heater 24. This applied clamping force assures good solid to solid contact between the outer annular heater 24 and the backplane 11 along angled wall 22 and angled surface 28, respectively.

Clamping member 34 also includes a plurality of inner retainers 38 which are threadably received within internally threaded bores 39 formed in radially cantilevered tabs 40 or segments which extend toward a center axis 42 of the heating chuck 10. Preferably, each inner retainer 38 includes an Allen head to allow threadable movement of the inner retainer 38 into engagement with the inner annular heater 30. By rotating each inner retainer 38 until a torque of about 25 pound-inches is achieved, a sufficient clamping force will be applied to the inner annular heater 30. This sufficient clamping force assures good solid to solid contact between the inner annular heater 30 and the backplane 11, thereby optimizing heat transfer therebetween.

Figure 2:
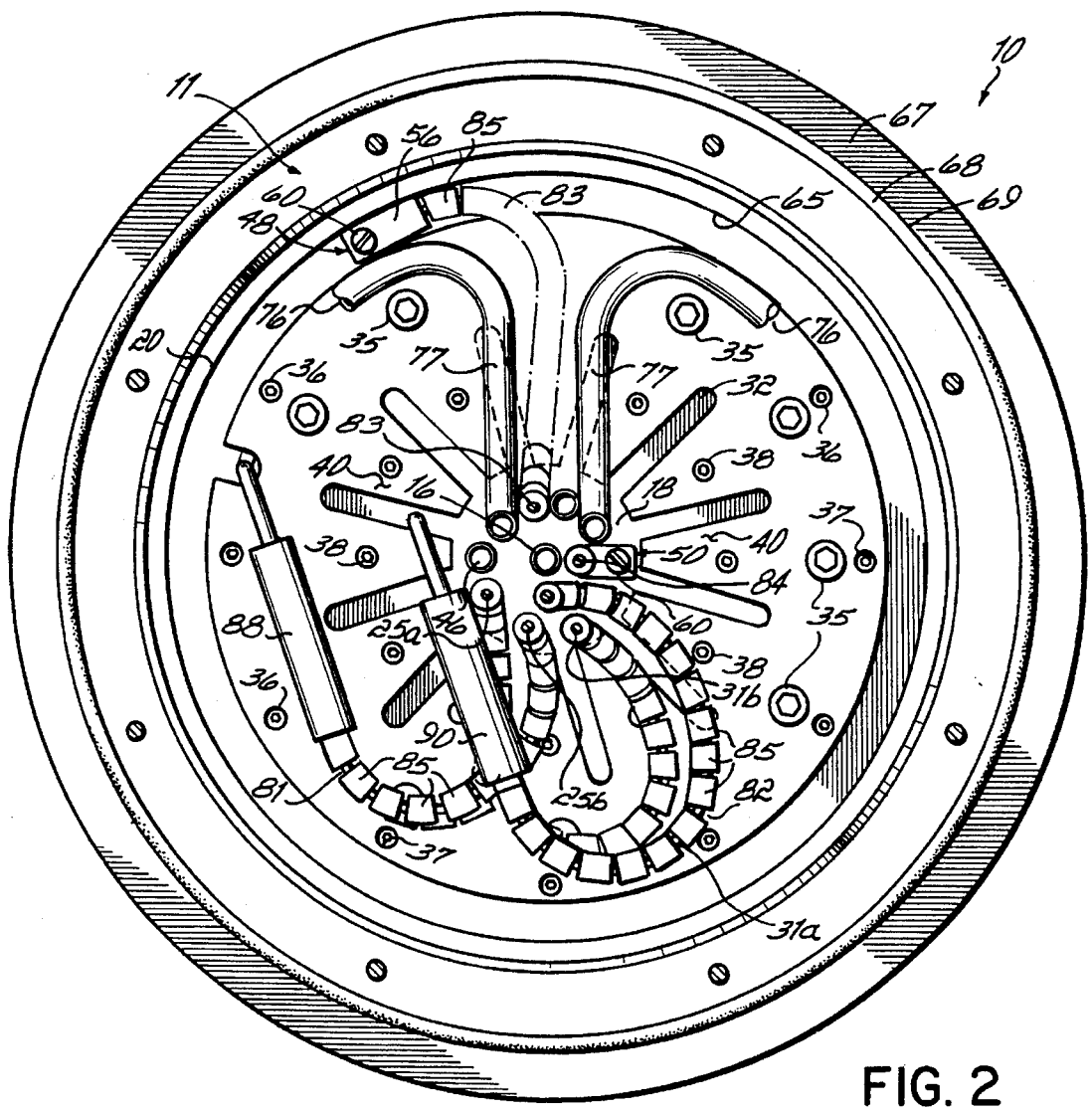
FIG. 2 is a cross-sectional view taken along lines 2—2 of FIG. 1.

As shown most clearly in FIG. 2, the segments or tabs 40 are trapezoidal in shape, when viewed in longitudinal cross-section and are formed to flex independently of one another. Thus, while tightening of an inner retainer 38 against the inner annular heater 32 may cause the respective tab 40 to flex and move away from the backplane 11, this movement away from the backplane 11 is independent of the other tabs 40, and does not affect clamping force supplied by the other retainers 38 and tabs 40. In short, clamping force supplied by each of the inner retainers 38 is independent of the other tabs 40 and retainers 38. As a result, consistent thermal contact is assured around the entire circumference of the inner heater 30. As the individual tabs flex, they provide positive contact between heater 30 and backplane 11 during thermal expansion and contraction.

The heating chuck 10 further includes backplane cooling channels 44 which are formed in the backplane 11 and are supplied with a liquid or gaseous coolant, such as water, air or nitrogen, via inlet 46 (FIG. 1). An outer heat sensor 48, preferably a thermocouple, senses the temperature of the backplane 11 adjacent the outer heating element 24, and an inner heat sensor 50, preferably a thermocouple, senses the temperature of the backplane 11 adjacent the inner heater 30. Each of the heat sensors 48 and 50 includes a sensing element, 52 and 54, which extends within or between an insulator 56 or 58 that is secured to the backplane 11 by a bolt, 60 or 62.

Preferably, the backplane 11 includes a rearward extension 65 which supports an outer flange 67. An O-ring 68 seats within a recess 69 in the outer flange 67 and provides a high vacuum seal between the heater chuck 10, and the adjacent apparatus, such as a sputter chamber (not shown). A cooling ring 70 mounts to outer flange 67, preferably by threaded screws 72. The cooling ring 70 includes a radially inwardly extending heat shield 74 which helps to contain heat generated by the heaters 24 and 30. An outer-cooling channel 76 cools the cooling ring 70, and the outer cooling channel 76 is supplied with liquid coolant, such as water, via outer coolant inlet 77.

The gas inlet 16, the outer heater 24, the inner heater 30, the outer sensor 48, the inner sensor 50, backplane coolant inlet 46 and the outer coolant inlet 77 cooperatively interact to provide uniformity in the temperature across the top surface of the wafer 12. To accomplish this, the heaters 24 and 30 and the sensors 48 and 50 directly connect to an electrical controller 80. Gas flow through gas inlet 16, and coolant gas or liquid flow through inlets 46, and liquid flow through inlet 77 may be controlled by valves (not shown) which are operatively connected to the electrical controller 80.

FIG. 2 shows the relative positions of electrical cables 81, 82, 83 and 84 which interconnect the outer heater 24, the inner heater 30, the outer sensor 48 and the inner sensor 50 with the controller 80. Two electrical leads 25a and 25b of element 25 exit from a cable 81, and the leads 25a and 25b terminate in sleeve portion 88 of coil element 25. From sleeve 88, the conductive leads of the coil element 25 extend in parallel fashion in an insulative sheath. The coil element 25 extends parallel with axis 42 through an outer recess 89 in clamping member 34. Similarly, electrical leads 31a and 31b of coil element 31 exit from a cable 82 and terminate in a sleeve portion 90. From there the conductive portions of the element 31 extend within a sheath. Leads 25a, 25b, 31a and 31b are preferably surrounded by insulative beads 85.

Figure 3:
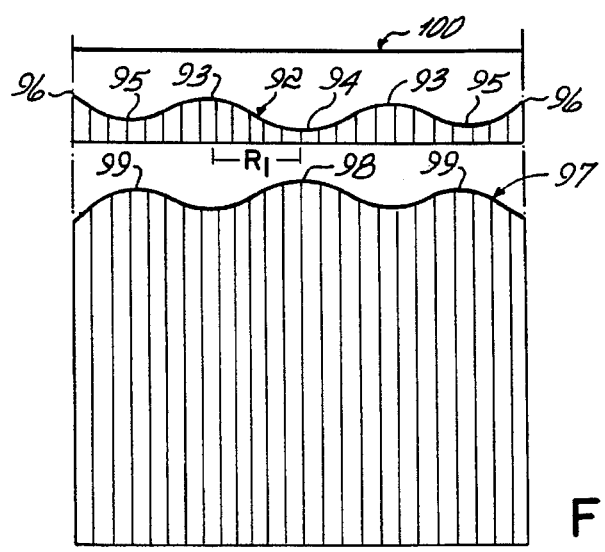
FIG. 3 is a temperature profile graph which illustrates an example of heat supplied to a wafer by a plasma during sputtering, the heat supplied to the wafer by the heating and cooling components of the heating chuck of FIG. 1 and FIG. 2, and the composite temperature profile across the surface of the wafer.

FIG. 3 graphically illustrates one of the advantages of the invention. Curve 92 shows the temperature profile across the top surface of the wafer which is produced by the plasma used to initiate and maintain the sputtering process. The curve 92 includes a peak 93 spaced away from the axis 42 by a radius $R_1$ with depressions 94 and 95 located radially inside and outside of $R_1$, respectively. Another peak 96 is located adjacent an edge of the wafer 12. The temperature at the center, represented by numeral 94, is slightly lower than the temperature at the outer depression 95.

Curve 97 represents the temperature profile of the backplane 11, and results primarily from the heaters 24 and 30. To achieve temperature uniformity across a wafer 12 during processing, the sum of curves 92 and 97 must be flat. Curve 97 shows a center peak 98 which results from heat generated by inner heater 30. Curve 97 also shows a peak 99 which results from heat generated by outer heater 22. In the illustrated example, peak 98 is slightly greater than peak 99. Depressions surround peak 99. The peaks 98 and 99 generally correspond to regions sensed by the inner sensor 50 and the outer sensor 48.

During sputtering, the temperature depressions 94 and 95 in curve 93 are sensed by the inner sensor 50 and the outer sensor 48. Based on the sensed temperature depressions, the controller 80 increases the currents, above reference values, to the inner heater 30 and the outer heater 24 to provide temperature compensation. In this example, current to inner heater 30 is increased slightly more than current to outer heater 24 because depression 94 is lower than depression 95. Thus, depending upon the temperatures measured by the sensors 48 and 50, current flow to the outer heater 24 and/or the inner heater 30 may be varied to shape the "heat added" profile represented by curve 97 so that, when combined with the process heat profile, as represented by curve 92, the composite heat profile is uniform, as represented by flat curve 100 in FIG. 3.

Additionally, the inner and outer cooling channels 44 and 76 may also be used to shape the heat profile represented by curve 97.

The above-described example relates to the previously described wafer heating chuck 10, which represents one preferred embodiment of the invention. In the described embodiment, two heaters and two sensors are used because some present sputter target assemblies employ two stationary plasma-shaping magnetic fields. The described embodiment provides sufficient control to shape the heat profile in a manner necessary to achieve a uniform composite profile with this type of sputter target assembly. However, it is to be understood that if more precise control is desired, additional heating elements and sensors may be employed at various radii from the axis 42.

FIGS. 4–8 illustrate an alternative embodiment of the wafer heating chuck of the present invention in which modifications to the inner and outer heaters, backplane, clamping member, and cooling ring are illustrated. The remaining elements are generally similar to those elements described hereinabove and are controlled by an appropriate controller as previously discussed to provide uniform heating of the wafer.

Referring now to FIG. 4, the inner heater 100 and the outer heater 102 each utilize a respective tubular heating element 104, 106 instead of the resistive elements with two parallel electrical leads as illustrated in FIG. 1 and FIG. 2. The tubular heating elements 104 and 106 are generally similar, and therefore, only heating element 104 will be discussed in detail.

Figure 7:
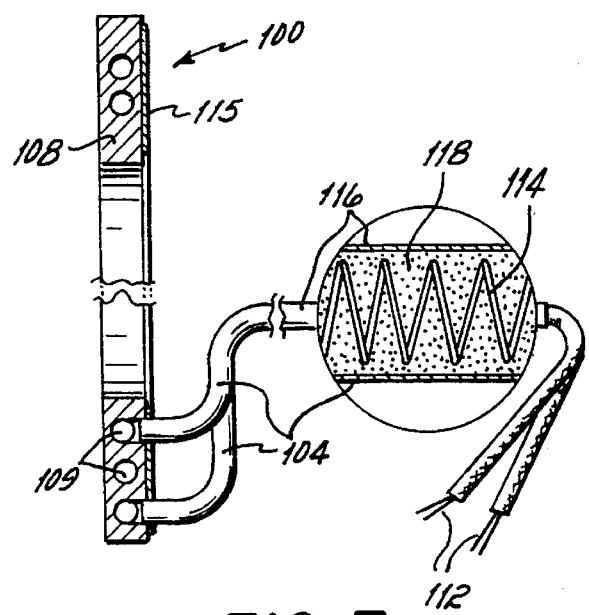
FIG. 7 is a side view, in partial cross-section; of the inner annular heater of FIG. 5.

Referring to FIGS. 4 and 7, inner heater 100 includes a heating ring 108 similar in shape to support ring 32 of the previous embodiment shown in FIGS. 1 and 2. Ring 108 includes spiral channel 109 formed therein to receive the tubular heating element 104 which is wound around ring 108 within channel 109 in a flat spiral. Preferably, ring 108 is formed of oxygen-free high conductivity copper for efficient heat transfer and is plated with a layer of nickel 110. Referring to FIG. 7, the inner tubular heating element 104 comprises a lead 112 which is connected to a suitable power source (not shown) through controller 113. The lead 112 is electrically connected to a spiral-shaped resistive wire portion 114 which is preferably formed of a nickel chromium alloy. Wire portion 114 is surrounded by a tubular metal sheath 116 which is preferably made of the high temperature nickel chromium alloy, Inconel 600 as discussed hereinabove. Powdered magnesium oxide 118 is contained within tubular metal sheath 116 and surrounds wire 114 to electrically isolate wire 114 from the tubular sheath 116. As current travels though wire 114 the resistance causes the wire to produce heat which is transferred to the tubular sheath 116 and ultimately to the inner heating ring 108. The tubular heating element 104 provides sufficient resistive heat to the ring 108 for efficient heating of the inner regions of the backplane 110 when the ring 108 is clamped into contact with backplane 111. Tubular heating element 104 is nickel brazed into the channel 109 of ring 108 to insure proper contact and heat transfer between element 104 and ring 108.

Figure 6:
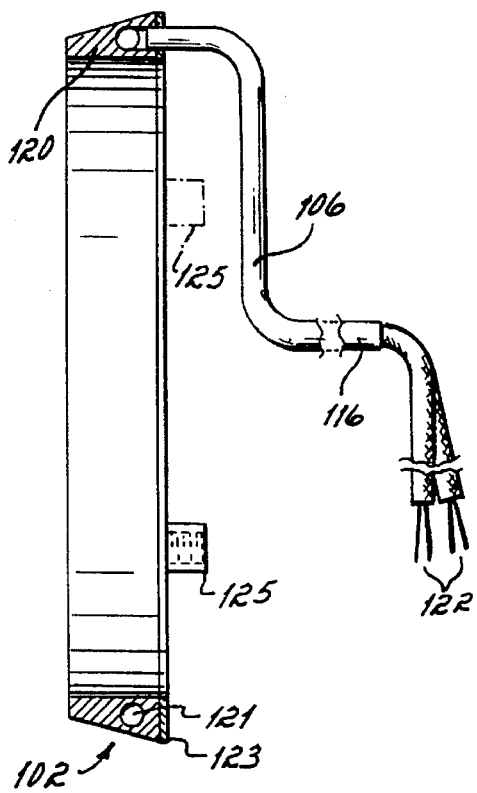
FIG. 6 is a side view, in partial cross-section, of the outer annular heater of FIG. 5.

Similarly, the wedge-shaped outer heating ring 120 of FIGS. 4 and 6 includes a channel 121 formed therein to receive tubular heating element 106 to heat the outer circumference of backplane 111 as described hereinabove (see FIG. 6). Tubular heating element 106 is similar in construction and operation to heating element 104 and is connected by a respective lead 122 to an appropriate power source (not shown) through controller 113. The outer ring 120 is also preferably formed of oxygen free high conductivity copper which is plated with nickel. The inner and outer heaters 100, 102 operate similarly to the inner and outer heaters of the previously described embodiment. That is, retainers 124, 126, such as Allen head screws or the like are utilized to clamp the inner and outer heaters, respectively, with the clamping member 128. The clamping force produced by clamping member 128 assures good solid to solid contact between the annular heaters 100, 102 and the backplane 111. Furthermore, the tubular heating elements 104, 106 and the respective rings 108, 120 provide more uniform heating of backplane 111 because the heating elements are embedded within channels in the rings instead of being wound around the outside of the rings as disclosed in the embodiment illustrated in FIGS. 1 and 2.

Figure 5:
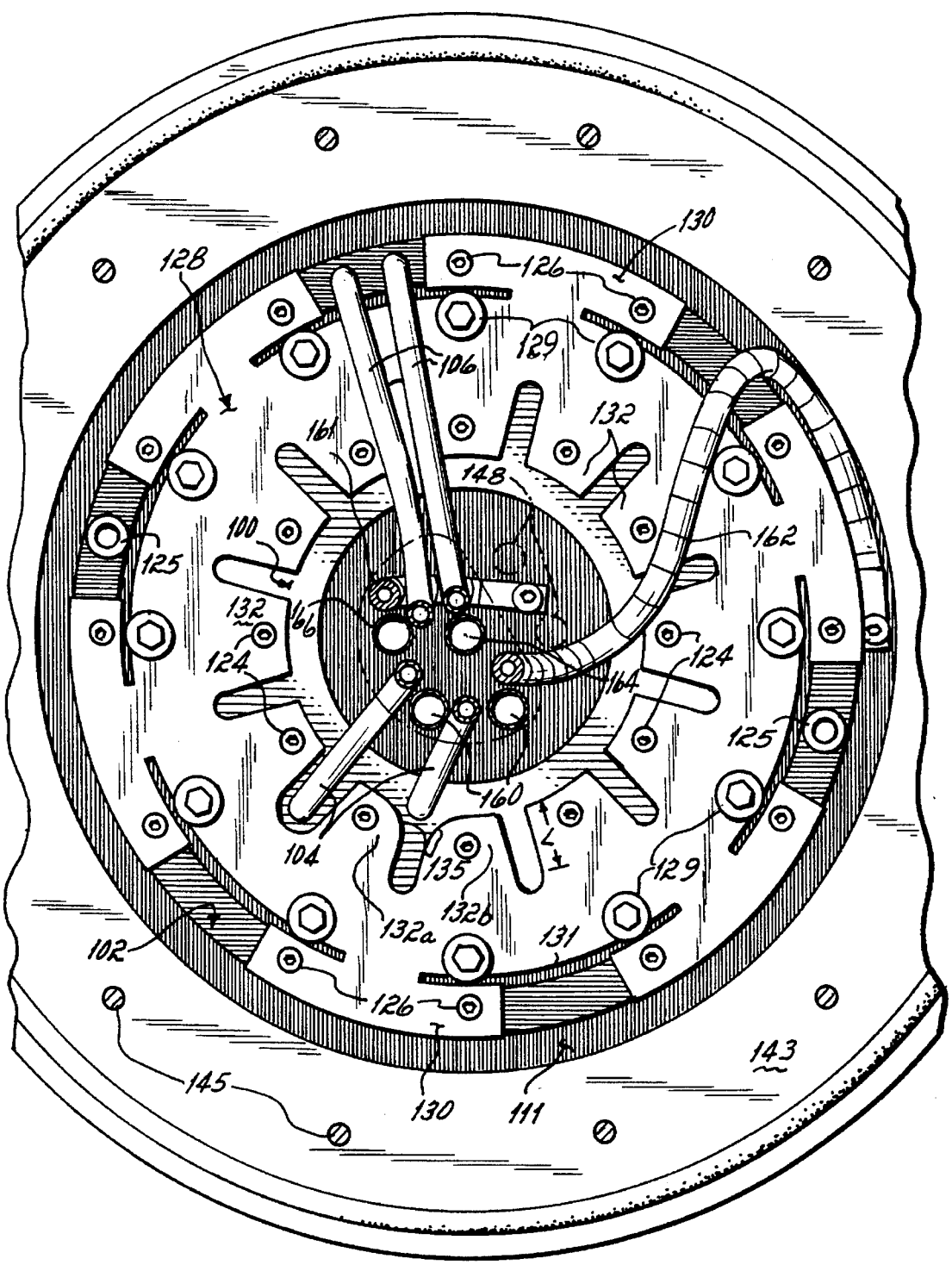
FIG. 5 is a cross-sectional view taken along lines 5—5 of FIG. 4.
Figure 5A:
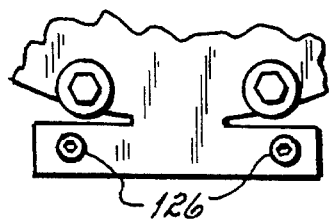
FIG. 5A is top view of an alternative embodiment of the outer tabs as shown in FIG. 5.

As best illustrated in FIG. 5, the clamping member 128 is modified in order to have flexible tabs to clamp both the inner and outer heaters 100, 102. More specifically, clamping member has a series of circumferentially cantilevered tabs 130 which are arranged around the peripheral edge 131 of the clamping member 128. The tabs 130 are elongated and are formed to be circumferentially cantilevered; however, tabs 130 might also be tangentially cantilevered as illustrated in FIG. 5A. Tabs 130 are coupled to respective portions of the outer heating ring 120 by retainers 126. Similar to the operation of the inner segments or tabs 40, the outer tabs or segments 130 are operable to flex when the retainers 126 are tightened against inner heating ring 120. Therefore, tightening retainer 126 against heater 120 may cause a respective tab 130 to move away from the backplane 111. The tab 130 flexes and forces ring 120 against the backplane for a more forceful thermal contact. Each tab 130 operates independently of adjacent tabs so that constant thermal contact is assured around the entire circumference of outer heater 102. As the individual tabs flex, they provide positive contact during thermal expansion and contraction.

A plurality of inner tabs 132 operate similarly to tabs 40 of the embodiment disclosed in FIG. 1 and FIG. 2; however, tabs 134 have been shortened in length L to provide more clearance in the center of clamping member 128 for the respective heater, heat sensor, gas, and coolant control and supply lines. As may be seen, two of the tabs 132a and 132b have been rounded at an edge 135. This is a design modification to provide clearance for the respective control lines and does not effect the operation of tabs 132a and 132b.

Each of the heating rings 108, 120 includes a stainless steel plate 115, 123, respectively on the back face thereof. The stainless steel plates contact the respective retainers 124, 126 and spread the clamping force of the retainers and tabs over the heating rings. Furthermore, the plates 115, 123 protect the nickel plating and the copper rings from being gouged by the retainers 124, 126 which are tightened down against the rings to clamp them against backplane 111. Preferably, plate 115 is brazed to ring 108 at approximately eight points spaced around ring 108, while plate 123 is brazed to ring 120. Plate 123 includes two extractor nuts 125 for heater removal in case of replacement. Extraction is accomplished by screwing in a suitable extraction bolt of an extracting device (not shown). Other bolts 129 secure the clamping member 128 to the backplane 111 (see FIGS. 4 and 5).

Figure 8:
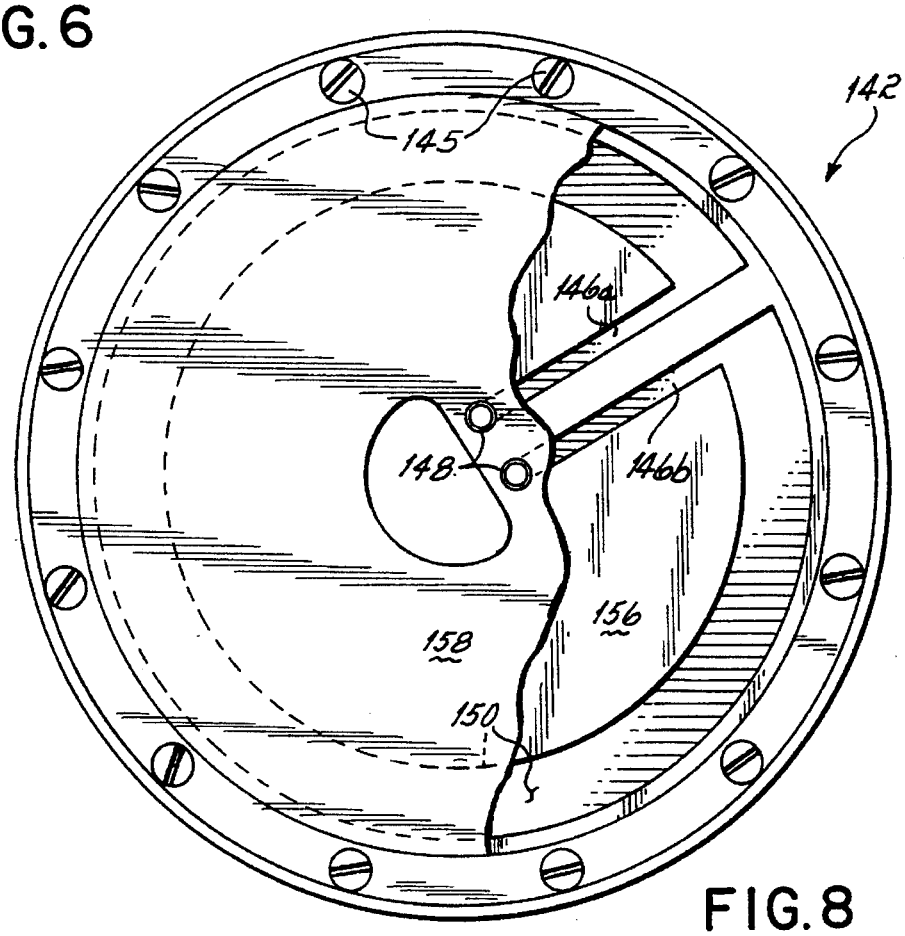
FIG. 8 is a cross-sectional view taken along lines 8—8 of the cooling ring of FIG. 5.

Referring again to FIG. 4, the heating chuck includes a cooling ring 142 which surrounds the heating chuck and generally defines the bottom of the chuck. Cooling ring 142 is mounted to a bottom flange 143 of backplane 111 such as by threaded screws 145. Cooling ring 142 is preferably machined of copper and is plated with a nickel coating. As illustrated in FIG. 8, cooling ring 142 includes two generally parallel distribution bores 146a, 146b which couple through a coolant line 148 to an appropriate coolant fluid supply (not shown) through controller 113. The bores 146a and 146b, in turn, connect to a circumferential channel 150. Coolant line 148 supplies water or some other suitable coolant liquid to cooling ring 142 which is operable to cool the outer flange 143 and the backside of the heating chuck. The upper surface 154 of cooling ring 142 also serves to reflect heat generated by the inner and outer heaters to contain the heat against backplane 111. As may be seen in FIGS. 4 and 8, the cooling ring includes an upper body 156 and a lower plate 158 which fit together and are brazed into a unitary cooling ring structure 142.

As illustrated in FIG. 5, the arrangement of the various control and supply lines for the heaters, sensors, coolant systems and gas systems utilized in the heating chuck of FIGS. 4–8 have been slightly modified from those of FIGS. 1 and 2. The different arrangement of the control lines is merely to provide better spacing within the center of the heating chuck. Lines 148 supply a coolant liquid to cooling ring 142. Lines 160 similarly provide a gas or liquid coolant to the backplane passage 163 for coolant purposes. Lines 161 and 162 connect to inner and outer thermal sensors or thermocouples, respectively. While tube 164 is a gas inlet tube for supplying backside gas to backplane 111 as previously discussed. A gas gauge tube 166 couples to one of the distribution spokes 167 in recess 168 of backplane 111. Gas gauge tube 166 receives backside heating gas and is coupled to a suitable pressure transducer (not shown) in order to measure the pressure of the backside heating gas. Preferably, the pressure of 8 Torr is maintained at a gas delivery rate of 10 to 40 sccm. The backside gas is monitored in order to maintain repeatable wafer temperature, temperature uniformity, and a short wafer heat-up time to thus insure optimum temperature uniformity and maximum wafer throughput and efficiency in the systems. Tubes 104a, 104b and 106a, 106b are the input and output line pairs for the inner and outer tubular heating elements 104, 106.

FIG. 9 shows an alternative version of the wafer heating chuck of the present invention which utilizes a larger 200 mm diameter backplane instead of a 150 mm backplane as shown in FIG. 4. The backplane 190 of FIG. 9 has been slightly modified to compensate for heating and fatigue of the backplane and to provide an alternative connection of the backplane to a cooling ring 192 while maintaining a similar spatial footprint inside of a reactor to the wafer heating chuck of FIG. 4. The internal arrangement of heating elements, sensors, and control lines is generally similar that shown in FIG. 4 and thus is not shown in FIG. 9.

Specifically, the top portion 194 of the backplane 190 has an annular angled surface 195 which connects directly to the wall 196 of the backplane. A deep undercut 198 is formed adjacent wall 196 and into top portion 194 to increase the effective length of the wall 196 and increase the thermal path of the wall to more effectively dissipate heat.

A second undercut 200 is made perpendicular the wall 196 at an end of the wall opposite portion 194. The undercut 200 receives a portion of a clamping segment 202 to clamp the cooling ring 192 to backplane 190.

The cooling ring 192 is generally similar to ring 142 in construction and operation. To secure ring 192 to backplane 190, three clamping segments 202 are fixed to the ring with screws 203. The segments are arcuate and extend a radius of approximately 100° each. The segments 202 are preferably spaced 2020 apart/around the periphery of ring 192. Each segment has a flange 204 which fits into the undercut 200 in the backplane to hold the ring against the backplane.

The present invention has been described herein in terms of various specific embodiments of the invention. The invention in its broader aspects is not limited to the specific details, representative apparatus and method, and illustrative examples shown and described. Accordingly, departures may be made from such details without departure from the spirit or scope of applicant's general inventive concept.

What is claimed is:

1. A wafer heating chuck comprising:
   a backplane having a first surface for mounting a wafer thereon and a second surface with an annular recess formed therein, the annular recess located adjacent an outer edge of the backplane and having an outer angled wall; and
   an outer annular backplane heater residing in the annular recess, the heater including an angled surface in engagement with the outer angled wall to promote heat transfer from the heater to the outer edge of the backplane.

2. The wafer heating chuck of claim 1 wherein the annular recess and the annular backplane heater are wedge-shaped in transverse cross section.

3. The wafer heating chuck of claim 1 further comprising:
   a clamping member secured to the second surface of the backplane; and
   an outer clamping device carried by the clamping member and engaging the outer annular backplane heater, the outer clamping device being movable with respect to the secured clamping member and backplane to clamp the angled surface of the outer annular backplane heater into intimate contact with the outer angled wall of the annular recess around the outer edge of the backplane.

4. The wafer heating chuck of claim 3 wherein the outer clamping device further comprises:
   a plurality of retainers threadably received within the clamping member and rotatable into and out of engagement with the outer annular backplane heater to clamp the outer heater at a plurality of positions.

5. The wafer heating chuck of claim 3 wherein the outer clamping device includes a plurality of outer cantilevered segments arranged around the periphery of the clamping member and proximate the outer annular heater, the outer cantilevered segments flexing generally independently of one another and of the clamping member and coupled to the outer segments so that clamping a portion of the outer annular heater at one of the flexing segments does not adversely affect a clamping force applied at the other flexing segments to other portions of the outer annular heater.

6. The wafer heating chuck of claim 5 wherein the outer clamping device further comprises:
   a plurality of retainers, at least one retainer threadably received into each flexing outer cantilevered segment and rotatable into and out of engagement with the outer annular backplane heater to flex the segment and clamp the outer heater.

7. The wafer heating chuck of claim 5 wherein each outer cantilevered segment is one of circumferentially cantilevered and tangentially cantilevered around the periphery of the clamping member.

8. The wafer heating chuck of claim 3, further comprising:

an inner annular backplane heater located radially inside of said outer annular backplane heater, the inner annular backplane heater engaging the backplane for heating an inner annular portion of the backplane;
   an inner clamping device carried by the clamping member and engaging the inner annular backplane heater, the inner clamping device being movable with respect to the secured clamping member and backplane to clamp the inner annular heater into intimate contact with the backplane.

9. The wafer heating chuck of claim 8 wherein the outer clamping device includes a plurality of inner cantilevered segments arranged radially around the clamping member proximate the inner annular heater, the inner cantilevered segments flexing generally independently of one another and of the clamping member and coupled to the inner segments so that clamping a portion of the inner annular heater at one of the flexing segments does not adversely affect a clamping force applied at the other flexing segments to other portions of the inner annular heater.

10. The wafer heating chuck of claim 9 wherein the inner clamping device further comprises:
    a plurality of retainers, at least one retainer threadably received into each flexing inner cantilevered segment and rotatable into and out of engagement with the inner annular backplane heater to flex the segment and clamp the inner heater.

11. The wafer heating chuck of claim 9 wherein each inner cantilevered segment is trapezoid-shaped in longitudinal cross-section.

12. The wafer heating chuck of claim 8 and further comprising:
    an inner temperature sensor for sensing the backplane temperature at an inner region thereof;
    an outer temperature sensor for sensing the backplane temperature at an outer region thereof; and
    controls operatively connected to each temperature sensor and to each annular backplane heater for controlling heating of the inner and outer portions of the backplane, thereby to achieve uniformity in surface temperature for a wafer mounted on the first surface of the backplane.

13. The wafer heating chuck of claim 1 further comprising:
    a recess formed in a first surface of the backplane; and
    a gas inlet in fluid communication with the recess, whereby, with a wafer supported on the backplane, gas supplied to the recess between the backplane and the wafer facilitates heat transfer therebetween.

14. The wafer heating chuck of claim 1 wherein the backplane has at least one channel formed therein to distribute coolant around the backplane for enhanced uniformity in the surface temperature of the backplane.

15. The wafer heating chuck of claim 1 further comprising a cooling ring coupled to the second surface of the backplane, the cooling ring including a channel to distribute coolant around the ring for containing heat generated by the heater within a backplane area.

16. A wafer heating chuck comprising:
    a backplane having a first surface for supporting a wafer thereon during wafer processing and a second surface with an outer annular recess formed therein, the recess having an outer angled wall;
    an outer annular heater located in the recess and including an outer angled surface in engagement with the angled wall, the outer annual heater engaging the angled wall for heating an outer annular portion of the backplane;

an inner annular heater located adjacent the second surface of the backplane radially inside of the outer annular heater, the inner annular heater engaging the backplane for heating an inner annular portion of the backplane; and a clamping structure secured to the backplane and clamping the inner annular heater and the outer annular heater into intimate surface contact with the backplane for efficient transfer of heat between the backplane and the heaters.

17. The wafer heating chuck of claim 16 wherein the clamping structure comprises:

a clamping member;

outer clamping segments carried by the clamping member and clamping the outer annular heater in intimate surface contact with the backplane, the outer clamping segments being generally independently clampable with respect to each other; and inner clamping segments carried by the clamping member and clamping the inner annular heater in intimate surface contact with the backplane, the inner clamping segments being generally independently clampable with respect to each other.

18. The wafer heating chuck of claim 17, the inner clamping segments including cantilevered tabs which flex and force portions of the inner annular heater against the backplane, the tabs flexing generally independently of each other such that clamping a portion of the inner annular heater at one tab does not adversely affect a clamping force at another tab.

19. The wafer heating chuck of claim 17, the outer clamping segments including cantilevered tabs operable to flex and force portions of the outer annular heater against the backplane, the tabs flexing generally independently of each other such that clamping a portion of the outer annular heater at one tab does not adversely affect a clamping force at another tab.

20. The wafer holder of claim 16 and further comprising:

an inner temperature sensor for sensing the backplane temperature at an inner region thereof;

an outer temperature sensor for sensing the backplane temperature at an outer region thereof; and controls connected to each temperature sensor and to each annular heater for controlling heating of the backplane to achieve uniformity in the surface temperature of a wafer supported on the first surface of the backplane.

21. The wafer heating chuck of claim 16 and further comprising:

a recess formed in the first surface of the backplane, and a gas inlet in fluid communication with the recess, whereby, with a wafer supported on the backplane, gas supplied to the recess between the backplane and the wafer facilitates heat transfer therebetween.

22. The wafer heating chuck of claim 16 wherein the backplane has at least one channel formed therein to distribute coolant around the backplane for enhanced uniformity in the surface temperature of the backplane.

23. A wafer heating chuck comprising:

a backplane having a first surface for supporting a wafer during wafer processing and a second surface opposite the first surface;

an outer annular heater engaging the second surface of the backplane at an outer annular region and heating an outer annular portion of the backplane;

an inner annular heater engaging the second surface of the backplane at an inner annular region and heating an inner annular portion of the backplane;

a clamping member secured to the second surface of the backplane;

a plurality of outer cantilevered segments carried by the clamping member and clamping the outer annular heater into intimate contact with the outer annular region of the backplane, each segment carrying a retainer engaging the outer annular heater to be tightened thereagainst to apply clamping force thereto, the segments operating generally independently one from the other such that tightening of a retainer of one segment does not affect the clamping force applied to the outer annular heater by adjacent retainers and segments;

a plurality of inner cantilevered segments carried by the clamping member and clamping the inner annular heater into intimate contact with the inner annular region of the backplane, each segment carrying a retainer engaging the outer annular heater to be tightened thereagainst to apply clamping force thereto, the segments operating generally independently one from the other such that tightening of a retainer of one segment does not affect the clamping force applied to the inner annular heater by adjacent retainers and segments.

24. The wafer heating chuck of claim 23 wherein the outer annular region of the second surface has a recess formed in the backplane, the recess having an outer angled wall and the outer annular heater being located in the recess and having an outer angled surface contacting the outer angled wall.

25. The wafer heating chuck of claim 23 and further comprising:

an inner temperature sensor for sensing the backplane temperature at the inner region thereof;

an outer temperature sensor for sensing the backplane temperature at the outer region thereof; and controls connected to each temperature sensor and to each annular heater for controlling heating of the backplane to achieve uniformity in the surface temperature of a wafer mounted on the first surface of the backplane.

26. The wafer heating chuck of claim 23 further comprising:

a recess formed in a first surface of the backplane; and a gas inlet in fluid communication with the recess, whereby, with a wafer supported on the backplane, gas supplied to the recess between the backplane and the wafer facilitates heat transfer therebetween.

27. The wafer heating chuck of claim 23 wherein the backplane has at least one channel formed therein to distribute coolant around the backplane for enhanced uniformity in the surface temperature of the backplane.

28. The wafer heating chuck of claim 23 further comprising a cooling ring coupled to the second surface of the backplane, the cooling ring including a channel to distribute coolant around the ring for containing heat generated by the heaters within a backplane area.

29. A wafer heating chuck comprising:

a backplane having a first surface for supporting a wafer during wafer processing and a second surface opposite the first surface;

a heater located adjacent the second surface of the backplane and engaging the backplane for heating a corresponding portion of the backplane;

a clamping member mounted to the second surface of the backplane; and a plurality of flexible clamping segments carried by the clamping member and engaging and clamping the heater into intimate contact with the backplane, the clamping segments being independently movable such that each segment engages and clamps the heater into contact with the backplane without adversely affecting a clamping force applied to the heater by adjacently located segments.

30. The wafer heating chuck of claim 29, the clamping segments including cantilevered tabs which flex and force portions of the heater against the backplane, the tabs flexing generally independently of each other such that clamping a portion of the heater at one tab does not adversely affect a clamping force at another tab.

31. The wafer heating chuck of claim 30 further comprising of a plurality of retainers, at least one retainer threadably received into each flexing tab and rotatable into and out of engagement with the heater to flex the tab and clamp the heater.

32. The wafer heating chuck of claim 29 wherein the clamping segments are arranged annularly around the heater to clamp annular portions of the heater to the backplane.

33. A method of uniformly heating a wafer with a wafer heating chuck having a backplane with a first and a second surface comprising:

positioning the wafer on the first surface of the backplane;

directing a heater against the backplane second surface with a clamping member to heat the backplane and wafer, the clamping member including a plurality of clamping segments positioned around the heater which are separately adjustable to clamp the heater against the backplane; and adjusting one clamping segment to clamp one portion of the heater to a portion of the backplane with a greater force than an adjacent clamping segment whereby to selectively heat various portions of the backplane and produce uniform heating of the wafer.

34. The method of claim 33 wherein the heater is an inner annular heater which is directed against an inner portion of the backplane with inner clamping segments the method further comprising the steps of:

directing an outer annular heater against an outer portion of the backplane with the clamping member, the clamping member further including outer clamping segments positioned around the outer annular heater which are separately adjustable to clamp the outer annular heater against the backplane; and adjusting one outer clamping segment to clamp one portion of the outer annular heater to a portion of the backplane with a greater force than an adjacent outer clamping segment whereby to selectively heat various portions of the backplane and further produce uniform heating of the wafer.

35. The method of claim 33 wherein the clamping segments include cantilevered tabs which flex independently from one another and retainers carried by the tabs and contacting the heater and which are movable against the heater to flex the tabs and clamp the heater, the method further comprising the step of moving a retainer of one tab such that the tab flexes to provide a greater clamping force than adjacent tabs to selectively heat portions of the backplane.

36. The method of claim 34 wherein the inner and outer clamping segments include inner and outer cantilevered tabs, respectively, which flex independently from one another, and inner and outer retainers carried by the inner and outer tabs, respectively, and contacting the respective heaters, the retainers being movable against their respective tabs to flex the tabs and clamp the heaters, the method further comprising the steps of:

moving a retainer of one inner tab such that the tab flexes to provide a greater clamping force than adjacent inner tabs to selectively heat inner portions of the backplane; and moving a retainer of one outer tab such that the tab flexes to provide a greater clamping force than adjacent outer tabs to selectively heat outer portions of the backplane;

whereby to selectively heat the backplane to provide uniform heating of the wafer.

37. The method of claim 33 further comprising the step of circulating a coolant medium through a channel in the backplane to selectively cool portions of the backplane and provide uniform heating of the wafer.

38. The method of claim 33 further comprising the step of circulating a coolant medium through a cooling ring secured to the backplane second surface to contain and dissipate heat generated by the heater for further uniform heating of the wafer.

39. The method of claim 33 wherein the heater is an outer annular heater having an angled surface, the method further comprising the step of directing the outer annular heater into a recess in the backplane second surface having an outer angled wall such that the surface and wall are engaged to promote heat transfer form the heater to an outer edge of the backplane.

40. The method of claim 34 further comprising the steps of:

sensing the temperature of the inner region of the backplane;

sensing the temperature of the outer region of the backplane;

controlling the temperature of the inner and outer annular heaters respectively with the sensed inner and outer region temperatures to further achieve temperature uniformity of the wafer.

41. The method of claim 33 further comprising the step of directing gas into a recess in the backplane first surface to facilitate heat transfer between the backplane and the wafer.

* * * * *

UNITED STATES PATENT AND TRADEMARK OFFICE
CERTIFICATE OF CORRECTION

PATENT NO. : 5,595,241

DATED : January 21, 1997

INVENTOR(S) : Vaclav Jelinek

It is certified that error appears in the above-identified patent and that said Letters Patent is hereby corrected as shown below:

Column 10, line 54, delete "similar that" and insert --similar to that--.

Column 11, line 4, delete "2020" and insert --20°--.

Column 12, line 66, delete "annual" and insert --annular--.

Column 16, line 39, delete "form" and insert --from--.

Signed and Sealed this

Fourth Day of November, 1997

*Attest:*

BRUCE LEHMAN

*Attesting Officer*     *Commissioner of Patents and Trademarks*